(12) United States Patent  
Ito (10) Patent No.: US 12,148,643 B2
(45) Date of Patent: Nov. 19, 2024

(54) CARRIER VEHICLE SYSTEM (71) Applicant: Murata Machinery, Ltd., Kyoto (JP)

(72) Inventor: Yasuhisa Ito, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 262 days.

(21) Appl. No.: 17/920,958

(22) PCT Filed: Mar. 8, 2021

(86) PCT No.: PCT/JP2021/008998
§ 371 (c)(1),
(2) Date: Oct. 24, 2022

(87) PCT Pub. No.: WO2021/220621
PCT Pub. Date: Nov. 4, 2021

(65) Prior Publication Data
US 2023/0170237 A1 Jun. 1, 2023

(30) Foreign Application Priority Data

Apr. 30, 2020 (JP) ................. 2020-080394

(51) Int. Cl.
*H01L 21/677* (2006.01)
*B65G 1/04* (2006.01)
*B66C 19/00* (2006.01)

(52) U.S. Cl.
CPC ...... *H01L 21/67724* (2013.01); *B65G 1/0464* (2013.01); *B66C 19/00* (2013.01); *H01L 21/67715* (2013.01); *H01L 21/6773* (2013.01); *H01L 21/67733* (2013.01)

(58) Field of Classification Search
CPC ......... H01L 21/67769; H01L 21/67724; H01L 21/67715; H01L 21/6773; H01L 21/67733; H01L 21/67736; B65G 1/0464; B65G 1/0457; B65G 1/0478; B66C 19/00
See application file for complete search history.

(56) References Cited

U.S. PATENT DOCUMENTS

| 2012/0114453 A1* | 5/2012 | Ota | H01L 21/67736 414/281 |
| 2017/0200626 A1* | 7/2017 | Takai | H01L 21/67769 |
| 2019/0189488 A1* | 6/2019 | Ito | B61B 3/02 |

FOREIGN PATENT DOCUMENTS

| WO | 2013/183384 | 12/2013 |
| WO | 2015/174181 | 11/2015 |
| WO | 2016/039023 | 3/2016 |

(Continued)

OTHER PUBLICATIONS

International Search Report dated May 25, 2021, of corresponding International Application No. PCT/JP2021/008998 along with an English translation.

*Primary Examiner* — Glenn F Myers
(74) *Attorney, Agent, or Firm* — DLA Piper LLP (US)

(57) ABSTRACT

A transport vehicle system includes a transport vehicle having a first travel unit configured to travel on a track and a transfer unit configured to move in a horizontal direction with respect to the first travel unit to transfer an article and a buffer vehicle having a second travel unit configure to travel on the track on which the transport vehicle travels and an article placement unit provided to be movable integrally with the second travel unit and to be able to deliver the article with the transfer unit of the transport vehicle.

12 Claims, 9 Drawing Sheets

(56) References Cited

FOREIGN PATENT DOCUMENTS

| WO | 2019/086237 | 5/2019 |
| WO | 2019/101725 | 5/2019 |
| WO | 2019/206672 | 10/2019 |

* cited by examiner

CARRIER VEHICLE SYSTEM

TECHNICAL FIELD

This disclosure relates to a transport vehicle system.

BACKGROUND

A transport vehicle system including a plurality of transport vehicles and controller to control the plurality of transport vehicles is known. As this type of system, for example, International Publication WO 2019/101725 discloses a system in which a vehicle transports an article (container) on a grid-patterned travel path.

In recent years, for such a transport vehicle system, improvement of transport efficiency of article is desired according to an increase in amount of throughput of articles.

Therefore, it could be helpful to provide a transport vehicle system capable of improving transport efficiency of article.

SUMMARY

We thus provide a transport vehicle system including a transport vehicle and a buffer vehicle. The transport vehicle includes a first travel unit configured to travel on a track and a transfer unit configured to move in a horizontal direction with respect to the first travel unit to transfer an article with respect to a placement part. The buffer vehicle includes a second travel unit configured to travel on the track on which the transport vehicle travels, and an article placement unit provided to be integrally movable with respect to the second travel unit and to be capable of delivering the article by the transfer unit of the transport vehicle.

In the transport vehicle system with this configuration, for example, the transport vehicle and the buffer vehicle move together or an article being held by the transport vehicle V is retreated temporarily to the buffer vehicle so that transport efficiency of article for a single transport vehicle can be increased.

The article placement unit may be provided to be capable of placing a plurality of the articles. To increase transport efficiency of article for a single transport vehicle, an existing transport vehicle is improved to allow the single transport vehicle to transport a plurality of article, thus increasing the transport efficiency of article. However, since the transport vehicle used for the transport vehicle system needs to travel on a track without interfering with other objects, an upper limit is specified for the size of the transport vehicle in a plan view seen from above. Therefore, it is not easy that the existing transport vehicle is configured to hold a plurality of articles. However, an article placement unit configured to place a plurality of articles is provided instead of a configuration of a transfer unit so that the size of a vehicle can be maintained. This allows many articles to be transported at a time, thus enabling improvement of the transport efficiency of article.

The transport vehicle system may further include a first rotation unit configured to rotate the article placement unit in a horizontal direction. With this configuration, the article placement unit of the buffer vehicle can optionally change its posture when delivering an article from/to the transport vehicle, thus enabling the transport vehicle to deliver the article from/to the buffer vehicle from various directions.

The transport vehicle system may further include a guide having a jump-out preventing function configured to prevent the article from jumping out from the article placement unit.

The first rotation unit may rotate the article placement unit between a first state in which the guide is not arranged between the article placement unit and the outside and the jump-out preventing function is disabled, and a second state in which the guide is arranged between the article placement unit and the outside and the jump-out preventing function is enabled. This configuration can easily realize the jump-out preventing function by using the function of the first rotation unit to rotate the article placement unit.

The transport vehicle system may further include a controller configured or programmed to control the buffer vehicle. The controller may prohibit the second travel unit from traveling when the article placement unit is in the first state and permit the second travel unit to travel when the article placement unit is in the second state. This can prevent the article from falling from the traveling buffer vehicle.

The transfer unit may have an article holding unit configured to hold the article, an elevating drive unit configured to change an elevation of the article holding unit, a sliding mechanism configured to slide the elevating drive unit in a horizontal direction, a second rotation unit configured to rotate the sliding mechanism in a horizontal direction, and a third rotation unit configured to rotate one of the article holding unit and the elevating drive unit in a horizontal direction. The transfer unit with this configuration can deliver an article from/to the article placement unit of the buffer vehicle from various directions in a predetermined posture.

Transport efficiency of article can thus be improved.

BRIEF DESCRIPTION OF THE DRAWINGS

FIG. 6 (A) is a view illustrating an article placement unit in a first state seen from VI-VI direction. FIG. 6 (B) is a view illustrating the article placement in a second state seen from VI-VI direction.

FIGS. 9 (A) to (D) are explanatory drawing illustrating variation of positional relation between the transport vehicle and the buffer vehicle.

REFERENCE SIGNS LIST

10 First body unit
10A Second body unit
12 Second rotation unit
13 Article holding unit
14 Elevating drive unit
16 Third rotation unit
17 Upper unit
18 Transfer device
20 First travel unit
20A Second travel unit 50 Transport vehicle controller
50A Buffer vehicle controller
60 Article placement device
61 Article placement unit
63 First rotation unit
65 Guide
M Article
SYS Transport vehicle system
V Transport vehicle
VB Buffer vehicle

DETAILED DESCRIPTION

Hereinafter, a transport vehicle system SYS according to an example will now be described with reference to the drawings. In the description of the drawings, the same elements will be denoted by the same reference symbols, without redundant description. Dimensional ratio of the drawings is not necessary the same as that of the descriptions. For convenience of explanation, an XYZ coordinate is defined in FIGS. 1 to 5. A plane parallel to a horizontal surface is referred to as an XY plane in an XYZ coordinate system. A direction along the XY plane is denoted by an X direction, and a direction orthogonal to the X direction is denoted by a Y direction. A direction perpendicular to the XY plane is denoted by a Z direction. For each of the X direction, the Y direction, and the Z direction, a direction indicated by an arrow in the drawings is plus (+) direction and an opposite direction of the direction indicated by the arrow is a minus (−) direction. A rotation direction around a vertical axis or a Z axis is denoted by θZ direction.

Figure 1:
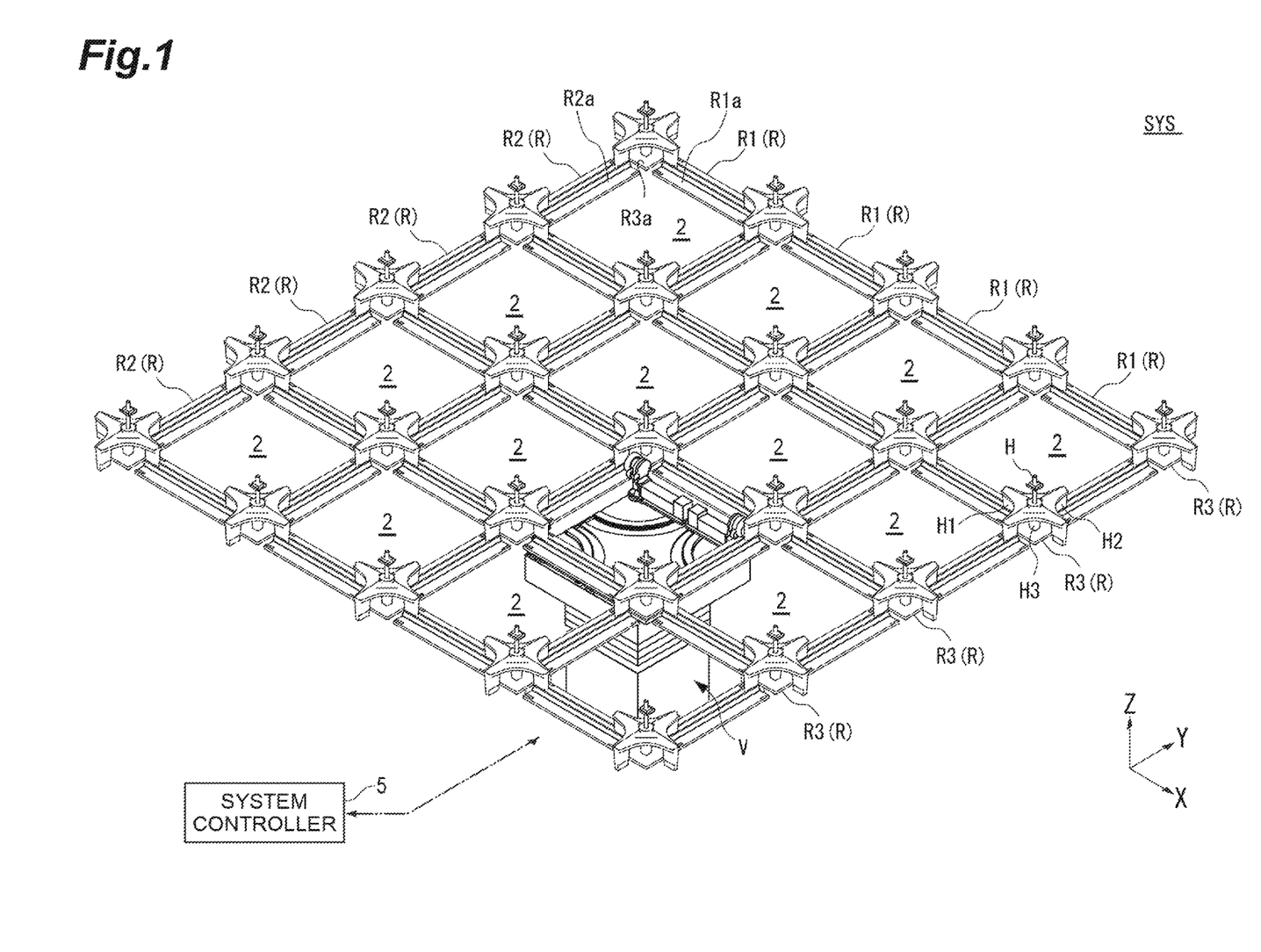
FIG. 1 is a perspective view illustrating an example of our transport vehicle system.
Figure 7:
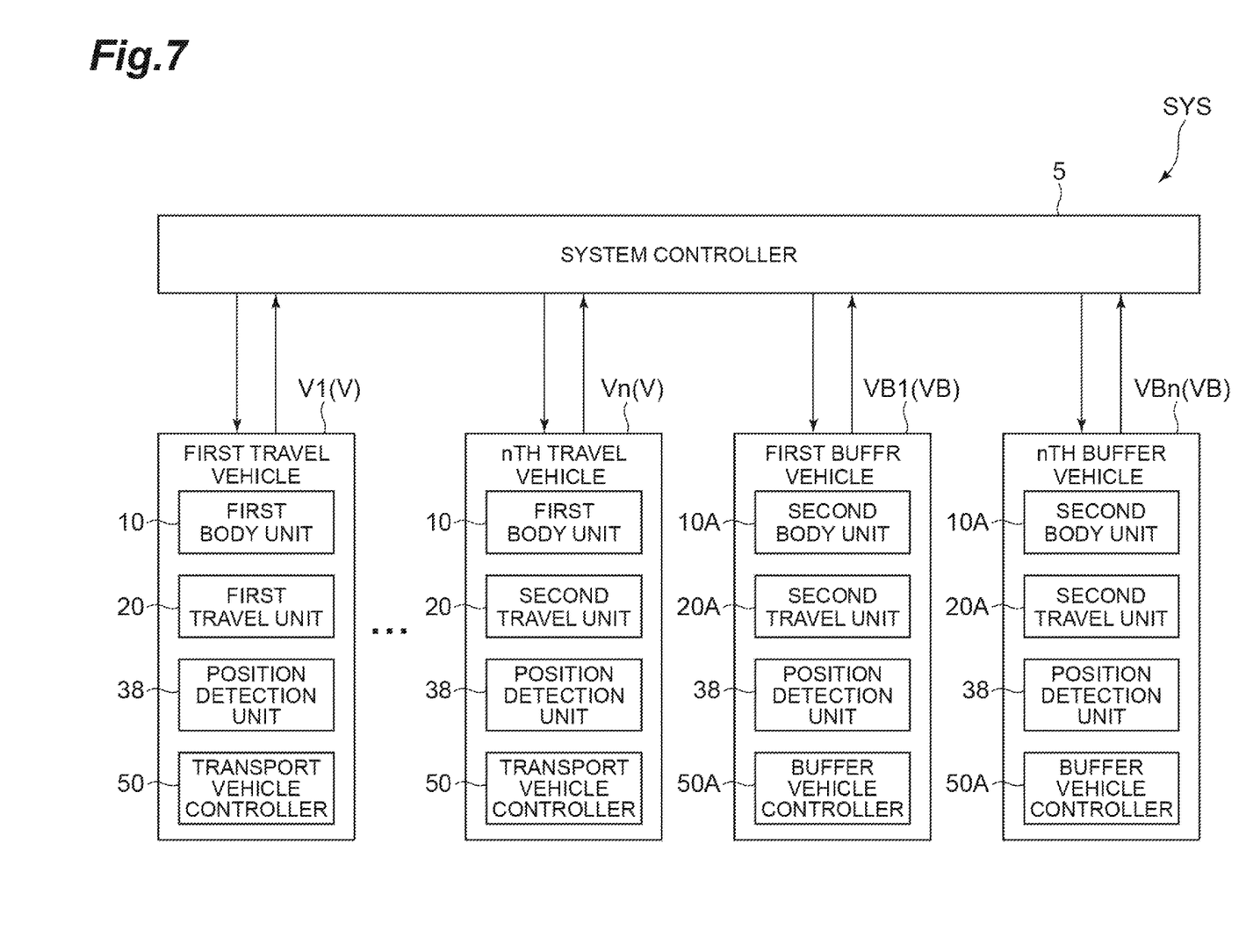
FIG. 7 is a block diagram illustrating a function structure of the transport vehicle system.

The transport vehicle system SYS illustrated in FIG. 1 is a grid system for transporting an article M by a transport vehicle V, for example, in a clean room of a semiconductor manufacturing factory. As illustrated in FIG. 7, the transport system SYS includes a first transport vehicle V1 to a nth transport vehicle Vn (hereinafter, may be correctively referred to as a transport vehicle V), a first buffer vehicle VB1 to a nth buffer vehicle VBn (hereinafter, may be correctively referred to as a buffer vehicle VB), and a system controller 5 configured or programmed to control a plurality of the transport vehicles V and a plurality of the bugger vehicles VB.

Figure 2:
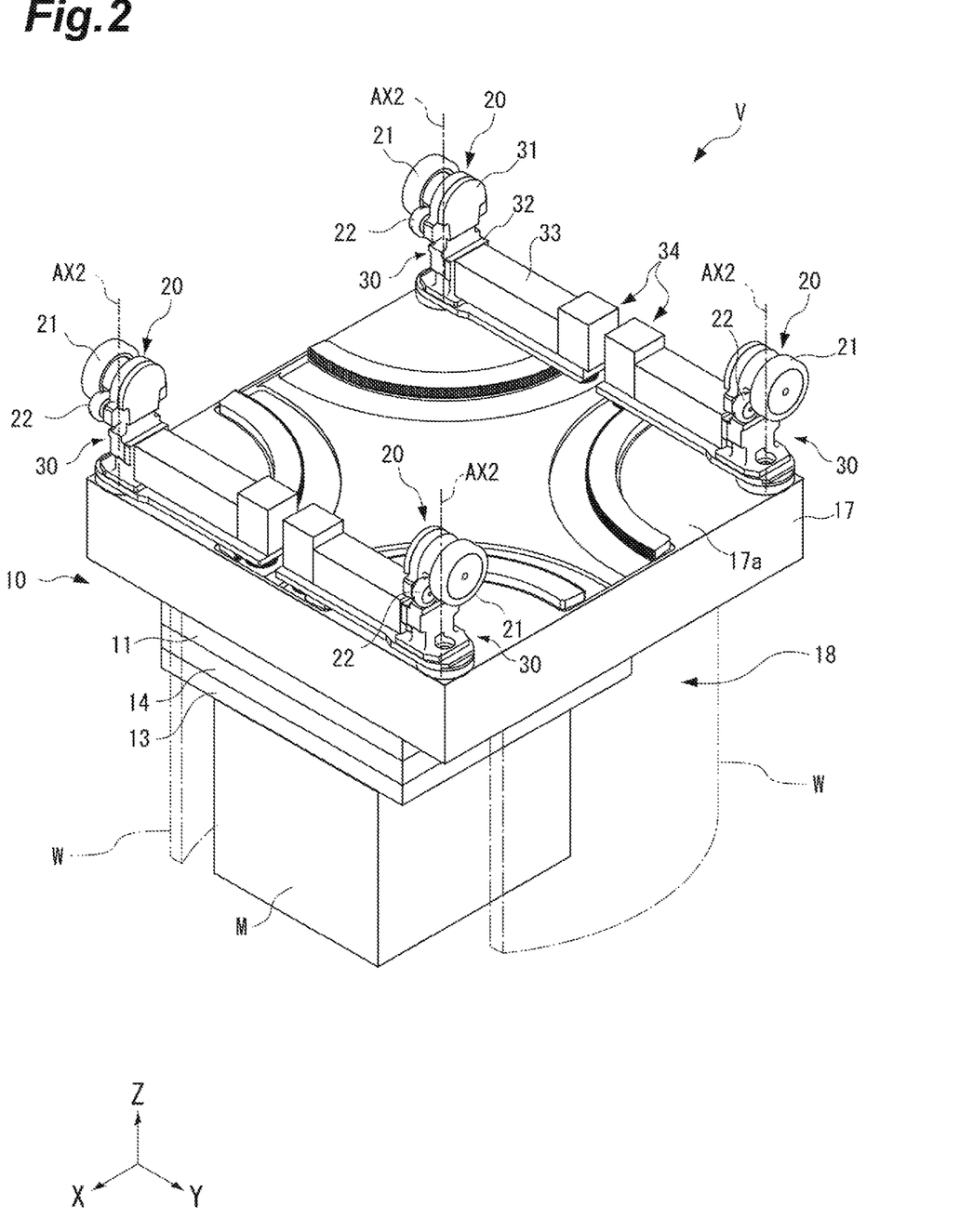
FIG. 2 is a perspective view illustrating an example of a transport vehicle.
Figure 3:
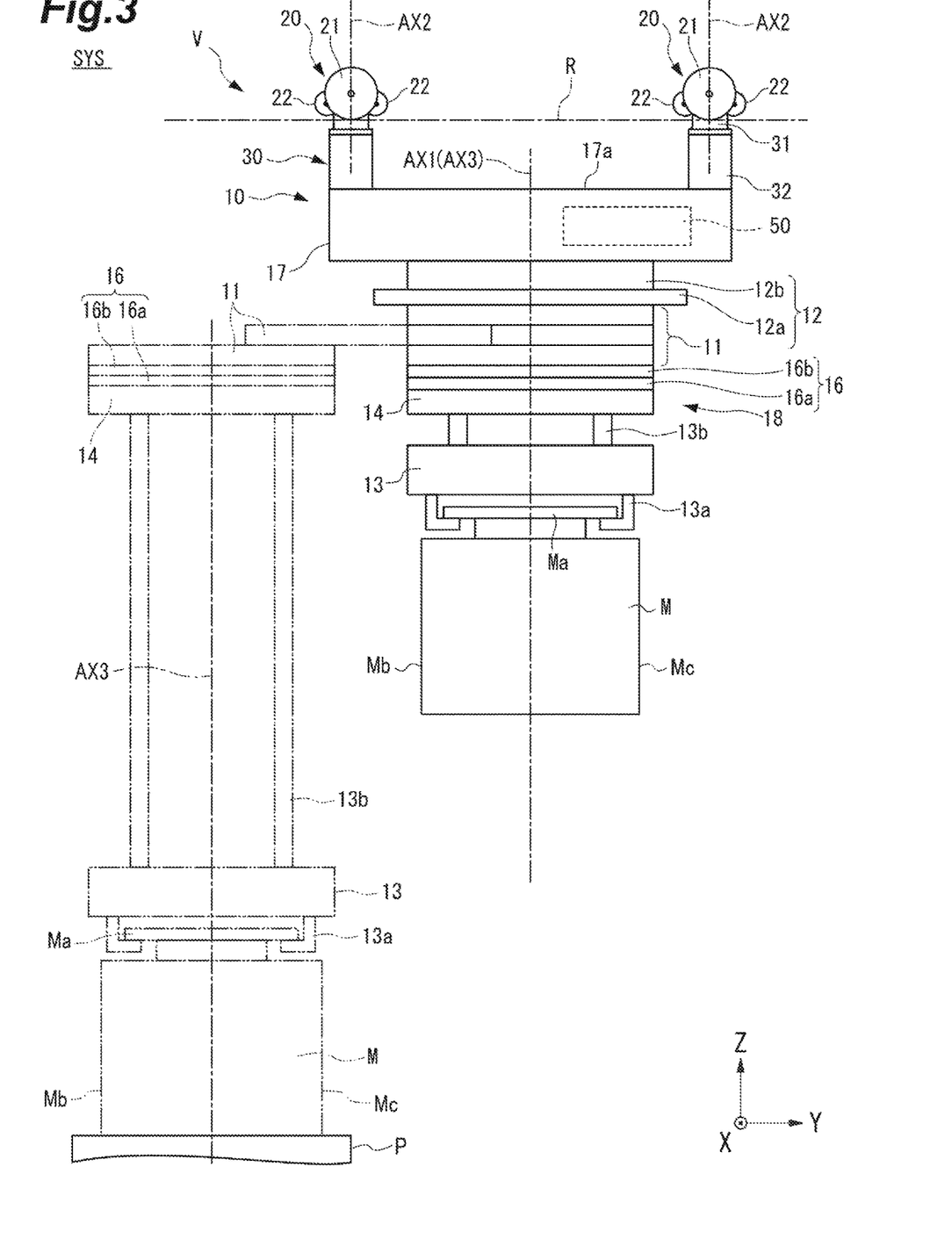
FIG. 3 is a side view illustrating an example of the transport vehicle.
Figure 4:
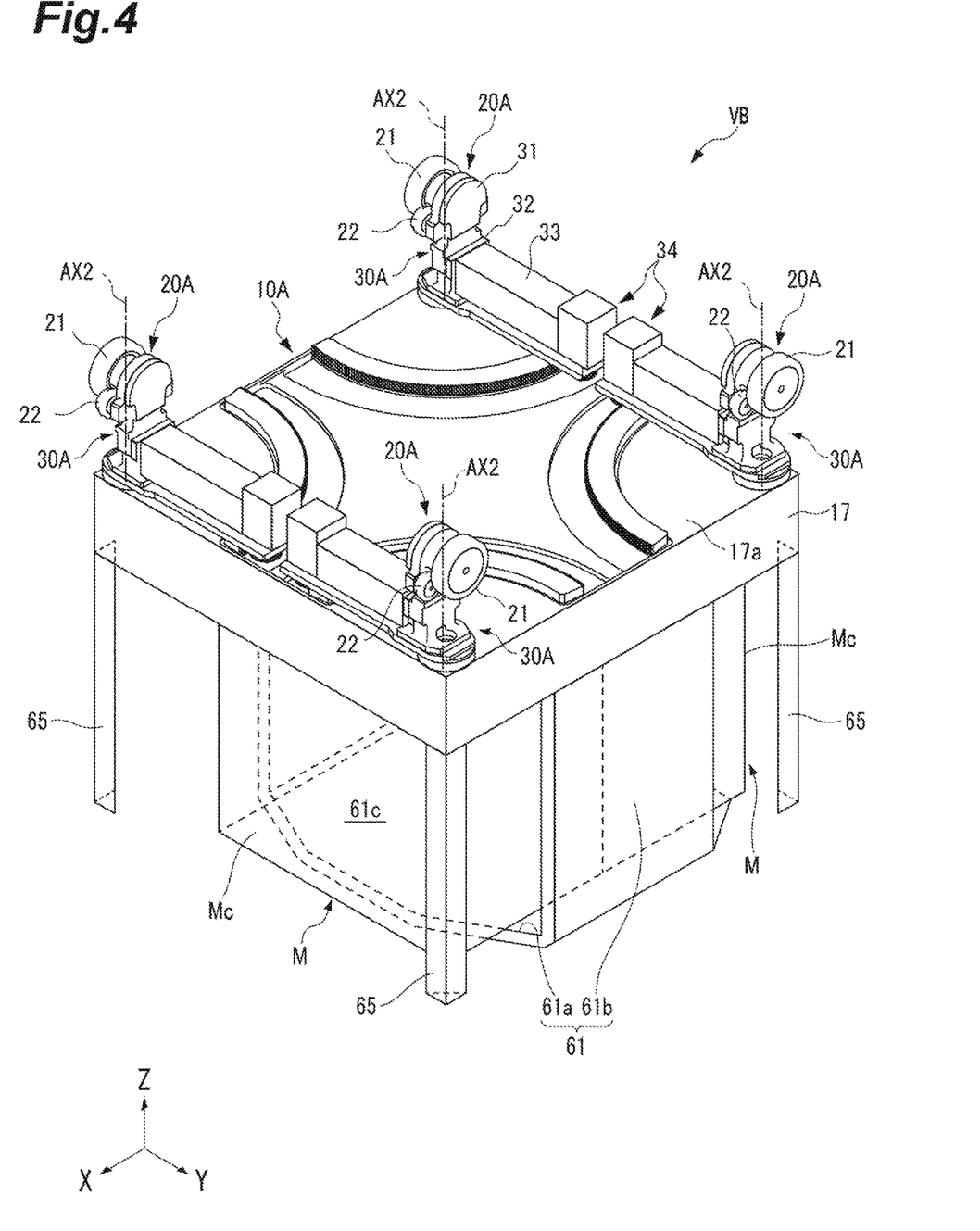
FIG. 4 is a perspective view illustrating an example of a buffer vehicle.
Figure 5:
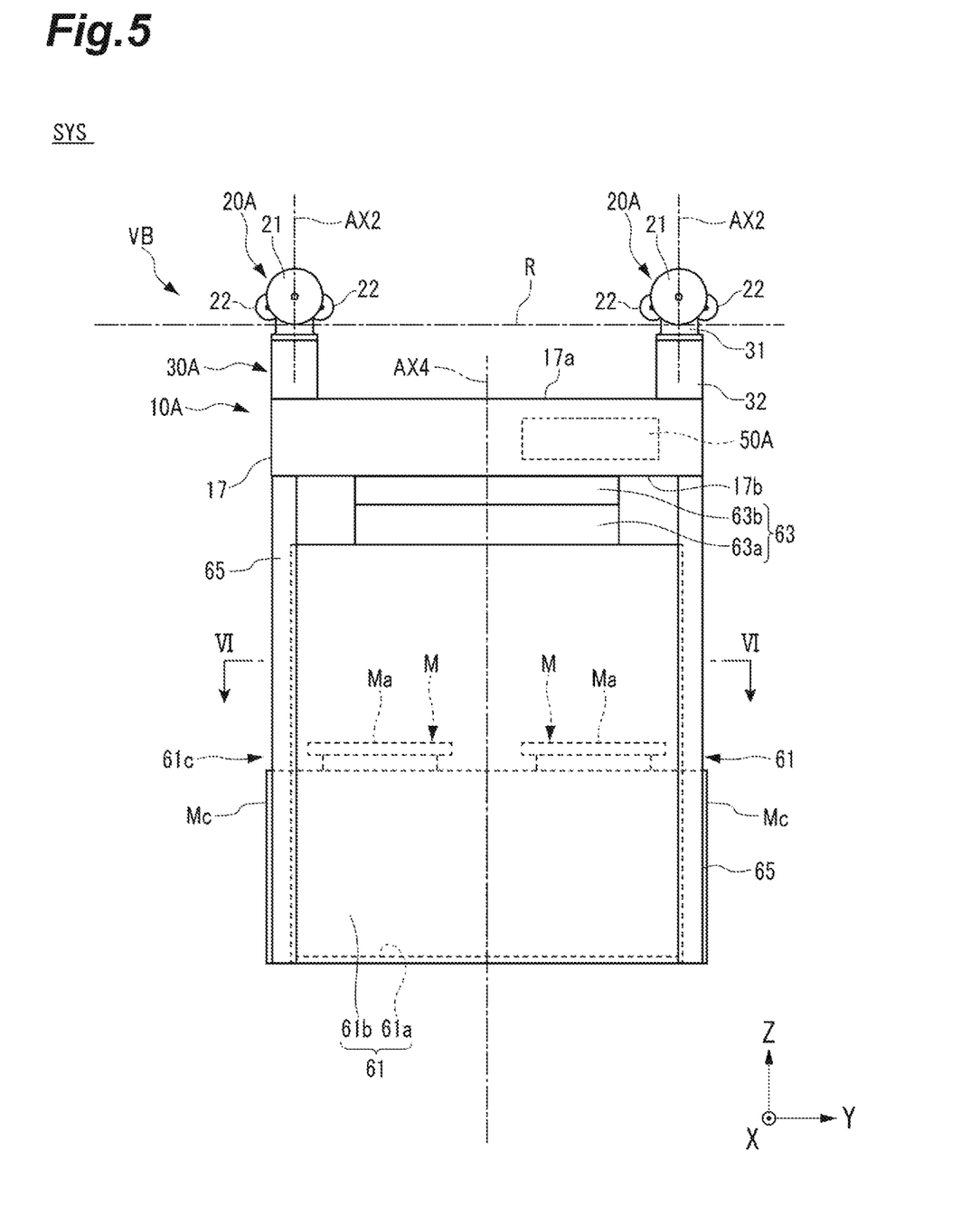
FIG. 5 is a side view illustrating an example of the buffer vehicle.
Figure 6:
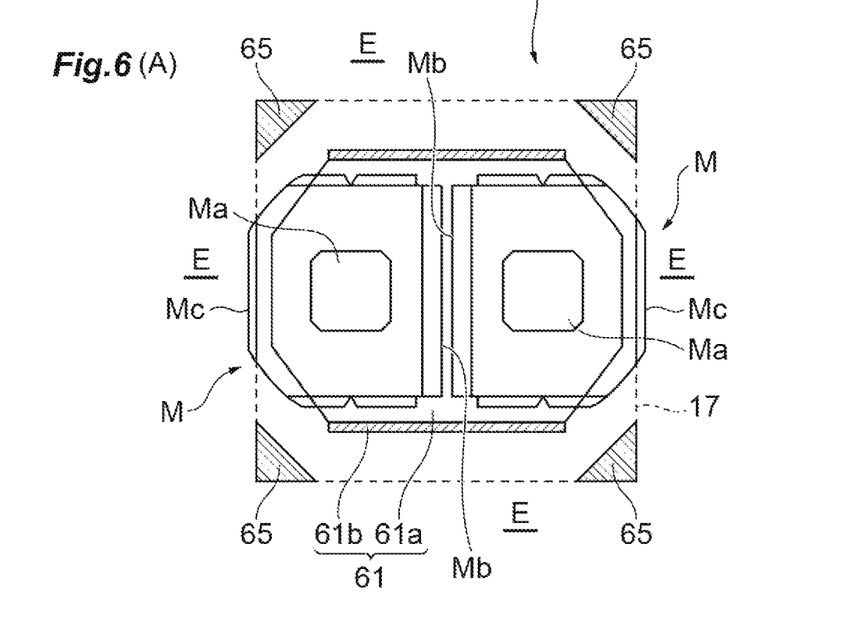

FIGS. 2 and 5 show an example for which the transport vehicle V (see FIGS. 2 and 3) and the buffer vehicle VB (see FIGS. 4 and 5) are overhead transport vehicles. The transport vehicle V and the buffer vehicle VB move along a rail (track) R of the transport vehicle system SYS. The rail R is a travel path for the transport vehicle V and the buffer vehicle VB. The transport vehicle V and the buffer vehicle VB move along the rail R of the transport vehicle system SYS and transport an article M such as a FOUP to accommodate semiconductor wafers or a Reticle Pod to accommodate reticles. In this example, as illustrated in FIG. 6 (A), it will be described that, as an example of the article M, the FOUP, which has a front surface Mb with a lid and a back surface Mc facing the front surface Mb, is transported.

As illustrated in FIG. 1, the rail R is laid on or near a ceiling of a facility such as a clean room. The rail R is provided adjacent to, for example, a processing device, a stocker (automated warehouse) or the like. The processing device is, for example, an exposure device, a coater developer, a film forming device, an etching device or the like to perform various processing on semiconductor wafers being housed in a container transported by the transport vehicle V. The stocker stores articles M transported by the transport vehicle V and the buffer vehicle VB. The rail R is an example of form of a travel path. The rail R is arranged in a grid-patterned shape in a plan view. The rail R extends in a horizontal direction and is suspended from a ceiling or the like. The rail R has a plurality of first rails R1, a plurality of second rails R2, and a plurality of intersections R3. Hereinafter, the rail R is referred to as a grid-patterned rail R.

The plurality of first rails R1 each extend in the X direction. The plurality of second rails R2 each extend in the Y direction. The grid-patterned rail R is formed by the plurality of first rails R1 and the plurality of second rails R2 in a grid-shape in a plan view. The grid-patterned rail R forms a plurality of square spaces with the plurality of first rails R1 and the plurality of second rails R2. The intersection R3 is arranged at a position where the first rail R1 and the second rail R2 are intersected with each other. The intersection R3 is adjacent to the first rail R1 in the X direction and adjacent to the second rail R2 in the Y direction. The intersection R3 is a connection track to connect the first rail R1 and the second rail R2 with each other, to connect the first rails R1 together, and to connect the second rails R2 together. The intersection R3 is a track used at any time when the transport vehicle V and the buffer vehicle VB travel along the first rail R1, when the transport vehicle V and the buffer vehicle VB travel along the second rail R2, and when the transport vehicle V and the buffer vehicle VB travel from the first rail R1 to the second rail R2 or from the second rail R2 to the first rail R1.

The grid-patterned rail R is provided in a direction in which the plurality of first rails R1 and the plurality of second rails R2 are orthogonal to each other so that a plurality of grid cells (cells) 2 are adjacent to each other in a plan view. A single grid cell 2 corresponds to a single square space and is a rectangular area surrounded by two first rails R1 adjacent to each other in the Y direction and two second rails R2 adjacent to each other in the X direction in a plan view. FIG. 1 illustrates a part of the grid-patterned rail R. The illustrated pattern continuously spreads in the X direction and in the Y direction to form the grid-patterned rail R.

The first rail R1, the second rail R2, and intersection R3 are suspended from a ceiling (not illustrated) and supported by a suspending member H (see FIG. 1). The suspending member H has a first portion H1 to suspend the first rail R1, a second portion H2 to suspend the second rail R2, and a third portion H3 to suspend the intersection R3. The first portion H1 and the second portion H2 are provided at two locations with the third portion H3 therebetween.

The first rail R1, the second rail R2, and the intersection R3 have traveling surfaces R1a, R2a, and R3a on which travel wheels 21 (described below) of the vehicle V and the buffer vehicle VB travel, respectively. A gap is each formed between the first rail R1 and the intersection R3 and between the second rail R2 and the intersection R3. When the transport vehicle V and the buffer vehicle VB travel on the first rail R1 and cross the second rail R2, or when the transport vehicle V and the buffer vehicle VB travel on the second rail R2 and cross the first rail R1, a first coupling unit 30 (described below), which is a part of the transport vehicle V and the buffer vehicle VB, passes through the gap between the first rail R1 and the intersection R3 and the gap between the second rail R2 and the intersection R3. Accordingly, the gap between the first rail R1 and the intersection R3 and the gap between the second rail R2 and the intersection R3 each have a width that allows the first coupling unit 30 to pass therethrough. The first rail R1, the second rail R2 and the intersection R3 are provided along the same horizontal surface. In this example, the traveling surface R1a of the first rail R1, the traveling surface R2a of the second rail R2, and the traveling surface R3a of the intersection R3 are arranged on the same horizontal surface.

The transport vehicle system SYS is provided with a communication system (not illustrated). The communication system is used for communication between the transport vehicle V and a system controller 5. The transport vehicle V and the buffer vehicle VB are each connected with the system controller 5 to enable a communication therebetween via the communication system.

Configuration of the transport vehicle V will be described. As illustrated in FIGS. 1 to 3 and 7, the transport vehicle V is provided to be able to travel along the grid-patterned rail R. The transport vehicle V has a first body unit 10, a first travel unit 20, first coupling unit 30, and a transport vehicle controller 50.

The first body unit 10 is arranged below (−Z direction side) the grid-patterned rail R. The first body unit 10 is formed, for example, in a rectangular shape in a plan view. The first body unit 10 is formed in a size that fits within a single grid cell 2 of a grid-patterned rail R in a plan view. This ensures a space that allows the transport vehicle V to pass another transport vehicle V and another buffer vehicle VB traveling on adjacent first rail R1 or adjacent second rail R2. The first body unit 10 includes an upper unit 17 and a transfer device (transfer unit) 18. The upper unit 17 is suspended from the first travel unit 20 via the first coupling unit 30. The upper unit 17 is, for example, in a rectangular shape in a plan view and has four corners on an upper surface 17a and a lower surface 17b.

The first body unit 10 has the travel wheel 21, the first coupling unit 30, and a direction changing mechanism 34 at each of four corners of the upper surface 17a. With this configuration, the travel wheels 21 arranged at the four corners of the upper surface 17a of the first body unit 10 enable stable suspension and support of the first body unit 10 and stable traveling of the first body unit 10.

The transfer device 18 moves in a horizontal direction with respect to the first travel units 20 and transfers an article M from/to a placement section such as a load port P or an article placement unit 61 of the buffer vehicle VB. The transfer device 18 is provided below the upper unit 17. The transfer device 18 can rotate around a rotation axis AX1 in the Z direction. The transfer device 18 has an article holding unit 13 to hold an article M below the grid-patterned rail R, an elevating drive unit 14 to move the article holding unit 13 up and down in the vertical direction, a third rotation unit 16 to rotate the elevating drive unit 14 in a horizontal direction, a sliding mechanism 11 to slide the elevating drive unit 14 in a horizontal direction, and a second rotation unit 12 to hold the sliding mechanism 11.

The load port P is a transfer destination or a transfer origin of the transport vehicle V and is a location where an article M is delivered from/to the transport vehicle V. For the buffer vehicle VB, it will be described later.

The article holding unit 13 grip a flange Ma of an article M to suspend and hold the article M. The article holding unit 13 is, for example, a chuck having claws 13a movable in a horizontal direction. The claws 13a are moved to the underside of the flange Ma of the article M and the article holding unit 13 is raised so that the article holding unit 13 holds the article M. The article holding unit 13 is connected to suspending members 13b such as wires or belts.

The elevating drive unit 14, which is, for example, a hoist, feeds out the suspending members 13b to lower the article holding unit 13 and reels in the suspending members 13b to raise the article holding unit 13. The elevating drive unit 14 is controlled by the transport vehicle controller 50 to move the article holding unit 13 up or down at a predetermined speed. Further, the elevating drive unit 14 is controlled by the transport vehicle controller 50 to hold the article holding unit 13 at a targeted height.

The third rotation unit 16 is provided between the sliding mechanism 11 and the elevating drive unit 14. The third rotation unit 16 has a rotating member 16a and a rotating drive portion 16b. The rotating member 16a is provided rotatably around an axis in the Z direction. The rotating member 16a supports the elevating drive unit 14. The rotating drive potion 16b, which is, for example, an electric motor, drives the rotating member 16a to rotate around the rotation axis AX3. The third rotation unit 16 is capable of rotating the rotating member 16a by driving force from the rotating drive portion 16b to rotate the elevating drive unit 14 and the article holding unit 13 around the rotation axis AX3.

The sliding mechanism 11 has, for example, a plurality of movable plates stacked in the Z direction. The elevating drive unit 14 is attached to the bottommost movable plate. In the sliding mechanism 11, the movable plates move in a direction perpendicular to a traveling direction of the transport vehicle V within a horizontal surface and the elevating drive unit 14 attached to the bottommost movable plate and the article holding unit 13 slide out (slide and move) in a direction perpendicular to a traveling direction of the transport vehicle V.

The second rotation unit 12 is provided between the sliding mechanism 11 and the upper unit 17. The second rotation unit 12 has a rotating member 12a and a rotating drive portion 12b. The rotating member 12a is provided rotatably around an axis in the Z direction. The rotating member 12a supports sliding mechanism 11. The rotation drive potion 12b, which is, for example, an electric motor, drives the rotating member 12a to rotate around the rotation axis AX1. The second rotation unit 12 is capable of rotating the rotating member 12a by driving force from the rotating drive portion 12b to rotate the sliding mechanism 11 (the elevating drive unit 14 and the article holding unit 13) around the rotation axis AX1. The transport vehicle V can deliver an article M from/to the load port P and the buffer vehicle VB (see FIG. 8) using the transfer device 18. Delivery of article M by the transport vehicle V from/to the buffer vehicle VB will be described later.

In a state in which the elevating drive unit 14 and the article holding unit 13 are not slid out by the sliding mechanism 11, the rotation axis AX1 and the rotation axis AX3 match with each other.

A cover W may be provided at the transport vehicle V. The cover W surrounds the transfer device 18 and an article M held by the transfer device 18. The cover W is in a shape with its bottom end opened and has an opening through which the movable plates of the sliding mechanism 11 protrude. The cover W, the upper end of which is attached to the rotating member 12a of the second rotating member 12, rotates around the rotation axis AX1 in accordance with a rotation of the rotating member 12a.

The first travel unit 20 has a travel wheel 21 and auxiliary wheels 22. The travel wheel 21 is arranged at each of four corners of the top surface 17a of the upper unit 17 (first body unit 10). Each travel wheel 21 is attached to an axle provided on the first coupling unit 30. Each travel wheel 21 is rotationally driven by driving force of a traveling drive unit 33. Each travel wheel 21 rolls on the grid-patterned rail R. Each travel wheel 21 rolls on the traveling surfaces R1a, R2a, and R3a of the first rail R1, the second rail R2, and the intersection R3, respectively, which causes the travel vehicle V to travel. Four of the travel wheels 21 are all rotationally driven by driving force of the traveling drive unit 33. However, this disclosure is not limited thereto, and only some of the four travel wheels 21 may be rotationally driven.

The travel wheel 21 is provided rotatably around a rotation axis AX2 in the θZ direction. The direction changing mechanism 34 (described below) rotates the travel wheel 21 in the θZ direction, which enables a change of traveling direction of the transport vehicle V as a result. The auxiliary wheels 22 are disposed at front and rear in traveling direction of the travel wheel 21 one by one. As with the travel wheel 21, the auxiliary wheels 22 are each capable of rotating around the axis of the axle parallel or substantially parallel along the XY plane. The auxiliary wheels 22 are provided such that the bottom ends thereof are higher than the bottom end of the travel wheel 21. Accordingly, when the travel wheel 21 travels on the traveling surfaces R1a, R2a, or R3a, the auxiliary wheels 22 do not come in contact with the traveling surfaces R1a, R2a, or R3a.

When the travel wheel 21 passes through a gap between the first rail R1 and the intersection R3 and a gap between the second rail R2 and the intersection R3, the auxiliary wheels 22 come in contact with the traveling surface R1a, R2a, R3a to prevent the travel wheel 21 from falling in the gap. Two auxiliary wheels 22 are provided at each travel wheel 21, however, the present invention is not limited thereto. For example, a single auxiliary wheel 22 or no auxiliary wheel 22 may be provided at each travel wheel 21.

The first coupling unit 30 couples the upper unit 17 of the first body unit 10 with the first travel unit 20. The first coupling unit 30 is provided at each of four corners of the top surface 17a of the upper unit 17 (first body unit 10). The first body unit 10 is suspended from the travel unit 20 by the first coupling unit 30, and is arranged below the grid-patterned rail R. The first coupling unit 30 has a support member 31 and a connection member 32. The support member 31 supports to be able to rotate a rotation axis of the travel wheel 21 and a rotation axis of the auxiliary wheel 22. The relative position between the travel wheel 21 and the auxiliary wheels 22 is retained by the support member 31. The support member 31 is formed, for example, in a plate shape with a thickness that allows it to pass through the gap between the first rail R1 and the intersection R3 and the gap between the second rail R2 and the intersection R3.

The connection member 32 extending downwards from the support member 31 couples with the upper surface 17a of the upper unit 17 to hold the upper unit 17. The connection member 32 includes therein a transmission mechanism, which transmits driving force of the traveling drive unit 33 (described below) to the travel wheel 21. In the transmission mechanism, a chain or a belt may be used, or a gear train may be used. The connection member 32 is provided rotatably around the rotation axis AX2 in the θZ direction. The rotation of the connection member 32 around the axis AX2 enables the travel wheel 21 to rotate around the rotation axis AX2 via the support member 31 in the θZ direction.

The first coupling unit 30 is provided with the traveling drive unit 33 and the direction changing mechanism 34. The traveling drive unit 33 is attached to the connection member 32. The traveling drive unit 33, which is, for example, an electric motor, is a drive source to drive the travel wheel 21. Each of the four travel wheels 21 is a driven wheel that is driven by the traveling drive unit 33. The four travel wheels 21 are controlled by the transport vehicle controller 50 to rotate at the same rotation speed.

The direction changing mechanism 34 causes the connection member 32 of the first coupling unit 30 to rotate around the rotation axis AX2, which enables the travel wheel 21 to rotate around the rotation axis AX2 in the θZ direction. The travel wheel 21 rotates in the θZ direction, whereby traveling direction of the transport vehicle V can be changed from the first state to the second state or from the second state to the first state. The first state is a state in which the vehicle V travels in the X direction and the second state is a state in which the vehicle V travels in the Y direction. The direction changing mechanism 34 rotates so that each of travel wheels 21 and the auxiliary wheels 22 arranged at four corners of the upper surface 17a rotates around the rotation axis AX2 within a range of 90-degree in the θZ direction.

The transport vehicle controller 50 controls how the direction changing mechanism 34 drives. A state in which the travel wheel 21 is in contact with one of the first rail R1 and the second rail R2 is changed to a state in which travel wheel 21 is in contact with the other of the first rail R1 and the second rail R2 by rotation of the travel wheel 21 and the auxiliary wheels 22. Therefore, traveling direction of the transport vehicle V can be changed between the first state in which the transport vehicle V travels in the X direction and the second state in which the transport vehicle V travels in the Y direction.

The transport vehicle V includes a location detecting unit 38 to detect locational information. The location detecting unit 38 detects a positional marker (not illustrated) indicating locational information to detect actual location of the transport vehicle V. The location detecting unit 38 detects the positional marker in a non-contact manner. The positional marker is placed for each grid cell 2 of the grid-patterned rail R.

The transport vehicle controller 50 controls comprehensively the transport vehicle V. The transport vehicle controller 50 is a computer including CPU (Central Processing Unit), ROM (Read Only Memory), RAM (Random Access Memory) or the like. The transport vehicle controller 50 can be configured as, for example, software in which program stored in ROM is loaded on RAM and is run by CPU. Also, the transport vehicle controller 50 may be configured as hardware such as an electric circuit. The transport vehicle controller 50 may be constituted by a single device or a plurality of devices. If the transport vehicle controller 50 is constituted by a plurality of devices, these devices are connected through communication network such as the Internet or intranet to create a single transport vehicle controller 50 logically. An example of the transport vehicle controller 50 provided at the first body unit 10 is described (see FIG. 3). However, the transport vehicle controller 50 may be provided outside the first body unit 10.

The transport vehicle controller 50 controls travel of the transport vehicle V in accordance with transport instructions. The transport vehicle controller 50 controls the traveling drive unit 33, the direction changing mechanism 34 or the like to control travel of the transport vehicle V. The transport vehicle controller 50 controls, for example, traveling speed, operations related to stop, and operations related to direction change. The transport vehicle controller 50 controls transferring operations of the transport vehicle V in accordance with transport instructions. The transport vehicle controller 50 controls the transfer device 18 or the like to control transferring operations of the transport vehicle V. The transport vehicle controller 50 controls gripping operations to grip an article M located on the article placement unit 61 of a predetermined load port P or buffer vehicle VB, and unloading operations to unload the article M being gripped onto the article placement unit 61 of a predetermined load port P or buffer vehicle VB.

Configuration of the buffer vehicle VB will be described. As illustrated in FIGS. 1 and 4 to 8, the buffer vehicle VB is provided to be travelable along the grid-patterned rail R on which the transport vehicle V travels. The buffer vehicle VB shares a traveling surface of the grid-patterned rail R on which the first travel unit 20 of the transport vehicle V travels.

The buffer vehicle VB has a second body unit 10A, a second travel unit 20A, a second coupling unit 30A, and a buffer vehicle controller 50A. Since configurations of the second travel unit 20A, the second coupling unit 30A, and the location detecting unit 38 included in the buffer vehicle VB are the same as those of the first travel unit 20, the first coupling unit 30, and the location detecting unit 38 included in the transport vehicle V, the detailed description is omitted herein.

The second body unit 10A is arranged below (−Z direction side) the grid-patterned rail R. The second body unit 10A is formed, for example, in a rectangular shape in a plan view. The second body unit 10A is formed in a size that fits within a single grid cell 2 of a grid-patterned rail R in a plan view. This enables the transport vehicle V to pass another transport vehicle V and another buffer vehicle VB traveling on adjacent first rail R1 or adjacent second rail R2. The second body unit 10A includes an upper unit 17, guides 65, and an article placement device 60. The upper unit 17 is suspended and supported by the second travel unit 20A via the second coupling unit 31A. The upper unit 17 is, for example, in a rectangular shape in a plane view and has four corners on the upper surface 17a.

The second body unit 10A has the travel wheel 21, the second coupling unit 30A and the direction changing mechanism 34 at each of four corners on the upper surface 17a. With this configuration, the travel wheels 21 arranged at the four corners on the upper surface 17a of the second body unit 10A enable a stable suspension and support of the second body unit 10A and a stable traveling of the second body unit 10A.

Each guide 65 is provided at each of four corners of the bottom surface 17b of the upper unit 17. The guide 65 is a triangle member extending downward from a base end being the bottom surface 17b toward a leading end. The guide 65 has a function to prevent articles M located on the article placement unit 61 from jumping out an outside E.

The article placement device 60 is a device onto which articles M are placed by the transfer device 18 of the transport vehicle V and from which the articles M are taken out by the transfer device 18 of the transport vehicle V. The article placement device 60 is provided below the upper unit 17. The article placement device 60 can rotate around a rotation axis AX4 in the Z direction. The article placement device 60 has the article placement unit 61 and a first rotation unit 63.

The article placement unit 61 is provided to be movable integrally with the second travel unit 20A and to be able to deliver an article M by the transfer device 18 of the transport vehicle V. The article placement unit 61 has a plate-shaped placement portion 61a onto which the article M is placed to enter a state in which the bottom surface of the article M is supported, and a plate-shaped side portion 61b that covers the sides of the article M and that connects between the placement portion 61a and the first rotation unit 63. For example, a plate-shaped member is bent by being pressed so that the article placement unit 61 is formed in a U-shape when viewed from the X direction in FIG. 4. Openings 61c are formed at both ends of the article placement unit 61 in +X direction and −X direction and the article placement unit 61 can deliver articles (take in and out) articles M from both sides of +X direction and −X direction. That is, the openings 61c of the article placement unit 61 are formed so that a movable plate of the sliding mechanism 11 holding an article M can enter there.

Two (a plurality of) articles M, M are placed on the article placement unit 61 such that front surfaces Mb, Mb of the two articles M, M face each other (see FIG. 6(A)). The article placement unit 61 is formed in a size that allows two articles M, M to be placed. More specifically, the article placement unit 61 is formed in a slightly smaller size than the upper unit 17 in a plan view and is formed in a size that enables rotation within a range of the upper unit 17. The article placement unit 61A may have a positioning pin to engage with a groove formed on the bottom of an article M.

The first rotation unit 63 is provided between the article placement unit 61 and the upper unit 17. The first rotation unit 63 has a rotation member 63a and a rotating drive portion 63b. The rotation member 63a is provided rotatably around an axis in the Z direction. The rotation member 63a supports the article placement unit 61. The rotating drive portion 63b, which is, for example, an electric motor, rotates the rotation member 63a around the rotation axis AX4. The first rotation unit 63 rotates the rotation member 63a by driving force from the rotating drive portion 63b, thus enabling the article placement unit 61 to rotate around the rotation axis AX4. That is, the first rotation unit 63 rotates the rotation member 63a by driving force from the rotating drive portion 63b, thus enabling the article placement unit 61 to rotate around the rotation axis AX4 in a horizontal direction.

As illustrated in FIGS. 9(A) to 9(D), the first rotation unit 63 rotates the article placement unit 61 according to a position of the transport vehicle V. More specifically, the first rotation unit 63 rotates the article placement unit 61 to adjust a position of the opening 61c of the article placement unit 61 to a sliding direction of the movable plate of the sliding mechanism 11 in the transport vehicle V. When a single article M is placed on the article placement unit 61, the first rotation unit 63 rotates the article placement unit 61 to adjust a position of opening 61c at a side on which no article M is placed to a sending direction of the movable plate of the sliding mechanism 11 in the transport vehicle V.

As illustrated in FIGS. 9(A) to 9(D), the first rotation unit 63 rotate the article placement unit 61 to enable delivery of an article M from four (front, rear, right, and left) directions (see FIG. 8) with respect to the transport vehicle V stopping at a predetermined position. The first rotation unit 63 is provided to be able to rotate the article placement unit 61 at least 270 degrees.

As illustrated in FIGS. 4 to 8, the first rotation unit 63 rotates the article placement unit 61 between a first state (see FIG. 6 (A)) and a second state (see FIG. 6(B)). The first state is a state in which no guide 65 is arranged between the opening 61c of the article placement unit 61 and the outside E to invalidate a jump-out preventing function and the second state is a state in which the guides 65 are arranged between the opening 61c of the article placement unit 61 and the outside E to validate the jump-out preventing function.

Figure 8:
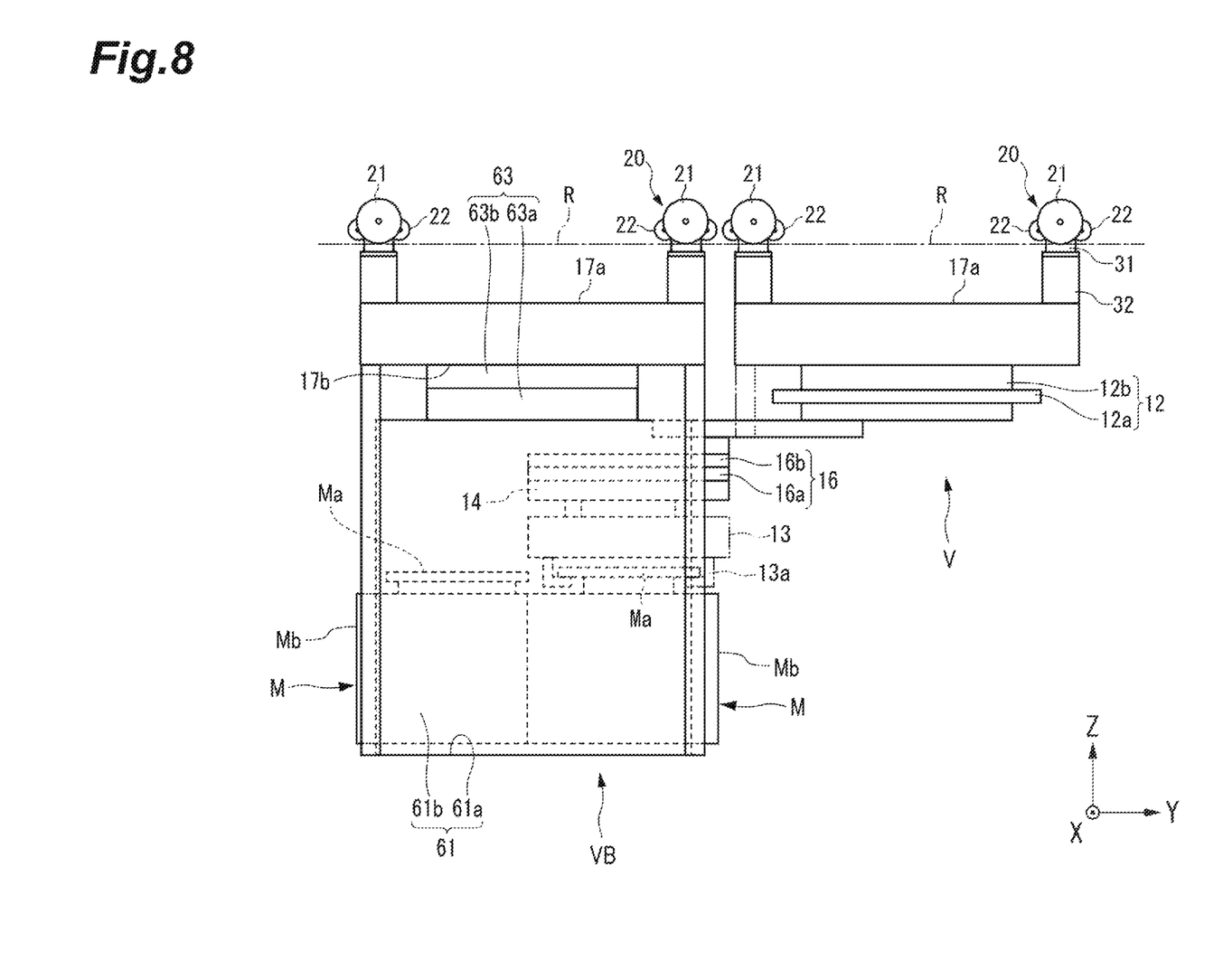
FIG. 8 is a side view illustrating a state in which an article is delivered between the transport vehicle and the buffer vehicle.
Figure 9:
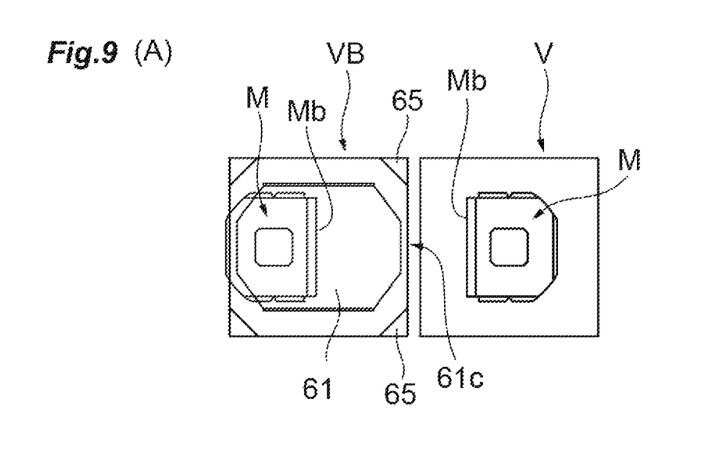

The first state illustrated in FIG. 6 (A) is a state of the article placement unit 61 when an article M is delivered from/to the transport vehicle V (see FIG. 8). The first state is a state in which the movable plate of the sliding mechanism 11 holding the article M is capable of entering. That is, in the first state, operations of the movable plate of the sliding mechanism 11 holding the article M are not inhibited by the side portions 61b and the guides 65. In the first state, back surfaces Mc of the articles M placed on a predetermined placement position slightly protrude to outside (slightly protrude from outline of the upper unit 17 in a plan view).

The second state illustrated in FIG. 6 (B) is a state of the article placement unit 61 when transporting articles M. The second state is a state in which the movable plate of the sliding mechanism 11 holding the article M is not capable of entering. That is, in the second state, operations of the movable plate of the sliding mechanism 11 holding the article M are inhibited by the side portions 61b and the guides 65. The articles M placed on the article placement unit 61 are inhibited by the guides 65 from jumping out from the opening 61c of the article placement unit 61 to the outside E, thus enabling a prevention of the articles M from jumping out from the article placement unit 61. In the second state, back surfaces Mc of the articles M placed on a predetermined placement position do not protrude to outside (do not protrude from outline of the upper unit 17 in a plan view).

The buffer vehicle controller 50A is configured or programmed to control the buffer vehicle VB comprehensively. The buffer vehicle controller 50A is a computer including CPU, ROM, and RAM and may be the same configuration as that of the foregoing transport vehicle controller 50.

The buffer vehicle controller 50A is configured or programmed to control a travel of the buffer vehicle VB in accordance with transport instructions. The buffer vehicle controller 50A controls the traveling drive unit 33, the direction changing mechanism 34 or the like to control a travel of the buffer vehicle VB. The buffer vehicle controller 50A controls, for example, traveling speed, operations related to stop, and operations related to direction change. The buffer vehicle controller 50A controls transfer operations of the buffer vehicle VB in accordance with the transport instructions.

The buffer vehicle controller 50A controls the first rotation unit 63 to link to transfer operations in the buffer vehicle VB. Specifically, the buffer vehicle controller 50A rotates the article placement unit 61 in accordance with a sliding direction of the movable plate of the sliding mechanism 11 of the transport vehicle V. The buffer vehicle controller 50A forbids the second travel unit 20A from traveling when the article placement unit 61 is in the first state and permits the second travel unit 20A to travel when the article placement unit 61 is in the second state.

The system controller 5 is a computer including CPU, ROM, and RAM and may have the same configuration as that of the foregoing transport vehicle controller 50. The system controller 5 selects any of a plurality of transport vehicles V capable of transporting articles M and assigns transport instructions to the selected transport vehicle V. The transport instructions include a traveling instruction to cause the transport vehicle V to travel to the load port P or to the article placement unit 61 of the buffer vehicle VB, and a gripping instruction to grip an article M being located on the load port P or the article placement unit 61 of the buffer vehicle VB or an unloading instruction to unload an article M being held by the transport vehicle V onto the load port P or the article placement unit 61 of the buffer vehicle VB.

Next, a delivery of an article M between the transport vehicle V and the buffer vehicle VB will be described. In response of a receipt of the gripping instruction to grip an article M being placed on the article placement unit 61 of the buffer vehicle VB or the unloading instruction to unload an article M being held by the transport vehicle V onto the article placement unit 61 of the buffer vehicle VB, the transport vehicle V moves to a grid adjacent to the buffer vehicle VB as instructed by the instruction, as illustrated in FIG. 8. The buffer vehicle VB rotates the article placement unit 61 to adjust a position of the opening 61c to a sliding direction of the movable plate in the transfer device 18 of the transport vehicle V that has moved to the adjacent grid.

In the transport vehicle V, the movable plate of the transfer device 18 slides to locate the article holding unit 13 holding an article M above the placement portion 61a in the article placement unit 61, and the elevating drive unit 14 is activated to move the article holding unit 13 holding the article M downwards. Whereby, transfer of the article M from transport vehicle V to the buffer vehicle VB is completed. Transfer of the article M from the buffer vehicle VB to the transport vehicle V is performed by following the above procedures in reverse.

Actions and effects of the transport vehicle system SYS in the foregoing examples will be described. In the transport vehicle system SYS in the foregoing examples, for example, the transport vehicle V and the buffer vehicle VB move together or an article M being held by the transport vehicle V is retreated temporarily to the buffer vehicle VB so that transport efficiency of the article M for a single transport vehicle V can be increased. In addition, in the transport vehicle system SYS in the foregoing examples, a temporary retreating unit for the article M (buffer port) suspended from a ceiling or installed on a floor can be constructed as a buffer vehicle VB.

In the transport vehicle system SYS in the foregoing examples, the article placement unit 61 of the buffer vehicle VB is provided to be able to place two (a plurality of) articles M, M thereon. In the configurations of the foregoing examples, the article placement unit 61 on which two articles M, M are placed is provided instead of configuration of a transfer unit included in a normal transport vehicle. Therefore, the size of the buffer vehicle can be maintained the same as that of the transfer vehicle.

The transport vehicle system SYS in the foregoing examples has the first rotation unit 63 configured to rotate the article placement unit 61 in a horizontal direction. Whereby, the posture of the article placement unit 61 of the buffer vehicle VB can be optionally changed when an article is delivered from/to the transport vehicle V, therefore, the transport vehicle V can deliver the article M from/to the buffer vehicle VB from various directions. As a result, the transport vehicle V need not move to a predetermined position (position of the opening 61c) with respect to the buffer vehicle VB, thus enabling further improvement of transport efficiency.

In the transport vehicle system SYS in the foregoing examples, the first rotation unit 63 rotates the article placement unit 61 between a first state (see FIG. 6 (A)) and a second state (see FIG. 6(B)). The first state is a state in which the guide 65 is not arranged between the opening 61c of the article placement unit 61 and the outside E to invalidate a jump-out preventing function and the second state is a state in which the guide 65 is arranged between the opening 61c of the article placement unit 61 and the outside E to validate a jump-out preventing function. With this configuration, the first state in which a jump-out preventing function is disabled and the second state in which a jump-out preventing function is enabled can be easily switched by use of a function of the first rotation unit 63 to rotate the article placement unit 61.

The buffer vehicle controller 50A in the transport vehicle system SYS in the foregoing examples inhibits the second travel unit 20A from traveling when the article placement unit 61 is in the first state and permit the second travel unit 20A to travel when the article placement unit 61 is in the second state. Whereby, an article M can be prevented from falling down from a traveling buffer vehicle VB.

One example was described as above, however, is not limiting. Various modifications can be made without departing from the scope of this disclosure.

An example illustrated a configuration in which two articles M can be placed on the buffer vehicle VB in the foregoing examples. However, only a single article M may be placed thereon or three or more articles M may be placed thereon. In addition, an example illustrated that the buffer vehicle VB in the foregoing examples realizes a function to prevent an article M from jumping out by the guide 65 and rotations of the first rotation unit 63 while the article M is transported. However, a stopper or the like to stop an article M in an engaged state may be provided in order to prevent the article M from jumping out.

An example illustrated the transport vehicle V in the foregoing examples including the second rotation unit 12 and the third rotation unit 16. However, the transport vehicle V may include neither of the second rotation unit 12 and the third rotation unit 16 or may include either one of the second rotation unit 12 and the third rotation unit 16.

The transport vehicle system SYS in the foregoing examples and modifications can be used as follows. As an example, the transport vehicle V and the buffer vehicle VB become a pair and move to the designated load port P. The transport vehicle V scoops up an article M and transfers the article M to the buffer vehicle VB. Thereafter, the transport vehicle V unloads the article M being placed on the buffer vehicle VB onto the load port P. When the articles M are delivered between the transport vehicle V and the buffer vehicle VB, rotation of the article placement unit 61 of the buffer vehicle VB enables both of the transport vehicle V and the buffer vehicle VB to deliver two articles M without traveling (moving) from a firstly designated position. In this manner, when an article M is taken out from one load port P and another article M is placed, an efficient processing becomes possible.

As another example of how to use, the transport vehicle V and the buffer vehicle VB share a traveling surface of a rail and are assigned a role on mainly traveling portion. For example, a predetermined grid range (rail range) is set to be a range in which the buffer vehicle VB mainly travels. The transport vehicle V delivers an article M from/to the buffer vehicle VB traveling in the predetermined grid range (rail range) at a boundary portion of the predetermined grid range (rail range). Whereby, the predetermined gird range (rail range) can be used as an area mainly for the purpose of transport or temporary storage of the article M.

For example, an area between buildings connects buildings with each other. Processing devices are installed in the buildings. The area between buildings can be the above-described predetermined grid range (rail range). That is, the above area between buildings is a zone in which the buffer vehicle VB mainly travel. The transport vehicle V delivers an article M from/to the buffer vehicle VB at both ends of the area between buildings. There is no space for a transfer of the article M in the area between buildings or, even if there is a space, the space is small. Therefore, transporting articles M by the buffer vehicle VB having no transferring function and being capable of transporting a plurality of articles M enables an efficient transport of the articles M. In addition, since the buffer vehicle VB has no transfer device, its vehicle weight is reduced. Whereby, transport speed of the buffer vehicle VB can be increased, thus enabling improvement of transport efficiency of the articles M.

In the transport vehicle system SYS in the foregoing examples and modifications, it was described as an example that the transport vehicle V and the buffer vehicle VB travel on the rail R arranged in a grid-shape. However, the transport vehicle V and the buffer vehicle VB in the foregoing examples and modifications may be applied to a conventional transport vehicle system traveling in one direction (including branching and joining) along a rail extending in one direction.

The invention claimed is:

1. A transport vehicle system comprising:
a transport vehicle including a first travel unit configured to travel on a track, and a transfer unit configured to move in a horizontal direction with respect to the first travel unit to transfer an article with respect to a placement part; and
a buffer vehicle including a second travel unit configured to travel on the track on which the transport vehicle travels, and an article placement unit provided to be integrally movable with respect to the second travel unit and capable of delivering the article by the transfer unit of the transport vehicle.

2. The transport vehicle system according to claim 1, wherein the article is a plurality of the articles, and the article placement unit is provided to be capable of placing the plurality of articles.

3. The transport vehicle system according to claim 1, further comprising:
a first rotation unit configured to rotate the article placement unit in a horizontal direction.

4. The transport vehicle system according to claim 3, further comprising:
a guide having a jump-out preventing function configured to prevent the article from jumping out from the article placement unit,
wherein the first rotation unit rotates the article placement unit between a first state in which the guide is not arranged between the article placement unit and the outside and the jump-out preventing function is disabled, and a second state in which the guide is arranged between the article placement unit and the outside and the jump-out preventing function is enabled.

5. The transport vehicle system according to claim 4, further comprising:
a controller configured or programmed to control the buffer vehicle,
wherein the controller prohibits the second travel unit from traveling when the article placement unit is in the first state and permits the second travel unit to travel when the article placement unit is in the second state.

6. The transport vehicle system according to claim 1, wherein the transfer unit has an article holding unit configured to hold the article, an elevating drive unit configured to change an elevation of the article holding unit, a sliding mechanism configured to slide the elevating drive unit in a horizontal direction, a second rotation unit configured to rotate the sliding mechanism in a horizontal direction, and a third rotation unit configured to rotate one of the article holding unit and the elevating drive unit in a horizontal direction.

7. The transport vehicle system according to claim 2, further comprising:

a first rotation unit configured to rotate the article placement unit in a horizontal direction.

8. The transport vehicle system according to claim 2,
wherein the transfer unit has an article holding unit configured to hold the article, an elevating drive unit configured to change an elevation of the article holding unit, a sliding mechanism configured to slide the elevating drive unit in a horizontal direction, a second rotation unit configured to rotate the sliding mechanism in a horizontal direction, and a third rotation unit configured to rotate one of the article holding unit and the elevating drive unit in a horizontal direction.

9. The transport vehicle system according to claim 3,
wherein the transfer unit has an article holding unit configured to hold the article, an elevating drive unit configured to change an elevation of the article holding unit, a sliding mechanism configured to slide the elevating drive unit in a horizontal direction, a second rotation unit configured to rotate the sliding mechanism in a horizontal direction, and a third rotation unit configured to rotate one of the article holding unit and the elevating drive unit in a horizontal direction.

10. The transport vehicle system according to claim 4,
wherein the transfer unit has an article holding unit configured to hold the article, an elevating drive unit configured to change an elevation of the article holding unit, a sliding mechanism configured to slide the elevating drive unit in a horizontal direction, a second rotation unit configured to rotate the sliding mechanism in a horizontal direction, and a third rotation unit configured to rotate one of the article holding unit and the elevating drive unit in a horizontal direction.

11. The transport vehicle system according to claim 5,
wherein the transfer unit has an article holding unit configured to hold the article, an elevating drive unit configured to change an elevation of the article holding unit, a sliding mechanism configured to slide the elevating drive unit in a horizontal direction, a second rotation unit configured to rotate the sliding mechanism in a horizontal direction, and a third rotation unit configured to rotate one of the article holding unit and the elevating drive unit in a horizontal direction.

12. The transport vehicle system according to claim 7,
wherein the transfer unit has an article holding unit configured to hold the article, an elevating drive unit configured to change an elevation of the article holding unit, a sliding mechanism configured to slide the elevating drive unit in a horizontal direction, a second rotation unit configured to rotate the sliding mechanism in a horizontal direction, and a third rotation unit configured to rotate one of the article holding unit and the elevating drive unit in a horizontal direction.

* * * * *